US011083100B2

(12) United States Patent
Shindo et al.

(10) Patent No.: US 11,083,100 B2
(45) Date of Patent: *Aug. 3, 2021

(54) ELECTRONIC DEVICE AND ELECTRONIC DEVICE TERMINAL COVER

(71) Applicant: Panasonic Intellectual Property Management Co., Ltd., Osaka (JP)

(72) Inventors: Kenichi Shindo, Osaka (JP); Futoshi Kuriyama, Saga (JP); Yusuke Katsuyama, Osaka (JP); Tatsuo Kuromoto, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/914,707

(22) Filed: Jun. 29, 2020

(65) Prior Publication Data

US 2020/0329576 A1    Oct. 15, 2020

Related U.S. Application Data

(63) Continuation of application No. 15/951,451, filed on Apr. 12, 2018, now Pat. No. 10,743,431, which is a
(Continued)

(30) Foreign Application Priority Data

Nov. 6, 2015   (JP) .............................. JP2015-218844

(51) Int. Cl.
*H05K 5/03*   (2006.01)
*G06F 1/16*   (2006.01)
*H01R 13/52*   (2006.01)

(52) U.S. Cl.
CPC ............. *H05K 5/03* (2013.01); *G06F 1/1616* (2013.01); *G06F 1/1656* (2013.01); *H01R 13/5213* (2013.01)

(58) Field of Classification Search
CPC ....... H05K 5/03; G06F 1/1656; G06F 1/1616; H01R 13/5213
See application file for complete search history.

(56) References Cited

U.S. PATENT DOCUMENTS

| 7,789,437 B2 * | 9/2010 | Sheng | ................... | G06F 1/1658 |
| | | | | 292/137 |
| 8,186,726 B2 * | 5/2012 | Zuo | ..................... | H04M 1/0274 |
| | | | | 292/57 |

(Continued)

FOREIGN PATENT DOCUMENTS

| CN | 101562954 A | 10/2009 |
| JP | 2009-238735 A | 10/2009 |

(Continued)

OTHER PUBLICATIONS

English Translation of Chinese Office Action dated Oct. 27, 2020 for the related Chinese Patent Application No. 201680061295.0.
(Continued)

*Primary Examiner* — Rockshana D Chowdhury
(74) *Attorney, Agent, or Firm* — Renner, Otto, Boisselle & Sklar, LLP

(57) ABSTRACT

An electronic device includes: a casing having an opening that houses a connection terminal inside; and a terminal cover that seals the opening such that the connection terminal is not exposed. The terminal cover includes a lid that seals the opening and a fixing part that fixes the terminal cover to the casing. The lid includes a protrusion and a cushion member, the cushion member being mounted around the protrusion and having a surface lower than a surface of the protrusion. The cushion member seals the opening by being in close contact with a member provided around the opening.

11 Claims, 8 Drawing Sheets

Related U.S. Application Data continuation of application No. PCT/JP2016/003473, filed on Jul. 27, 2016.

(56) References Cited

U.S. PATENT DOCUMENTS

| | | | |
|---|---|---|---|
| 9,560,782 B2 * | 1/2017 | Lee | G06F 1/1656 |
| 9,668,370 B1 * | 5/2017 | Huang | G06F 1/1656 |
| 10,050,374 B1 * | 8/2018 | Lee | H01R 13/5202 |
| 2009/0219676 A1 | 9/2009 | Murakata | |
| 2009/0262489 A1 | 10/2009 | Lin et al. | |
| 2010/0313485 A1 * | 12/2010 | Kuo | H05K 5/061 49/484.1 |
| 2011/0255229 A1 | 10/2011 | Murakata | |
| 2012/0250272 A1 * | 10/2012 | Wang | H04M 1/18 361/752 |
| 2013/0271902 A1 * | 10/2013 | Lai | H04R 1/02 361/679.01 |
| 2013/0286569 A1 | 10/2013 | Murakata | |
| 2015/0022955 A1 * | 1/2015 | Yamaguchi | H05K 5/0239 361/679.01 |

FOREIGN PATENT DOCUMENTS

| | | |
|---|---|---|
| JP | 2011-129307 A | 6/2011 |
| JP | 2014-137849 A | 7/2014 |

OTHER PUBLICATIONS

Allowed claims of parent U.S. Appl. No. 15/951,451, filed Apr. 12, 2018.

International Search Report for corresponding Application No. PCT/JP2016/003473, dated Sep. 6, 2016.

* cited by examiner ically the same configuration may be omitted. This is to avoid unnecessary redundancy of the following description and to facilitate understanding by those skilled in the art.

ELECTRONIC DEVICE AND ELECTRONIC DEVICE TERMINAL COVER

CROSS-REFERENCE TO RELATED APPLICATIONS

This application is a continuation under 35 U.S.C. § 120 of U.S. application Ser. No. 15/951,451, filed Apr. 12, 2018, which is a continuation of International Application No. PCT/JP2016/003473, filed Jul. 27, 2016, the entire contents of which are incorporated herein by reference.

BACKGROUND

1. Technical Field

The present disclosure relates to an electronic device terminal cover having waterproof and dust-proof properties and an electronic device including the terminal cover.

2. Description of the Related Art

PTL 1 discloses a waterproof terminal cover that seals and closes an opening in which a connection terminal of a mobile terminal is housed. The waterproof terminal cover in PTL 1 includes a seal part, a main body, and an extension hook. The seal part is made of an elastic member. The seal part includes a stopper having a projected shape and pressed into the opening to hermetically close the opening, and a flange that abuts on a peripheral edge of the opening. The main body is made of a material having higher rigidity than the material of the seal part, and is integrally molded with the seal part. The main body constitutes an appearance by covering the seal part. The extension hook is integrally extended from the main body, and is locked by a front side cabinet to prevent the main body from falling out.

According to the waterproof terminal cover in PTL 1, the seal part is made of the elastic member, and includes the stopper having the projected shape and pressed into the opening to hermetically close the opening, and the flange that abuts on the peripheral edge of the opening. The main body is made of the material having higher rigidity than the material of the seal part, and constitutes the appearance. The seal part is integrally molded with the main body. This realizes the waterproof terminal cover easily manufactured with a simple configuration and having an enhanced waterproof property.

CITATION LIST

Patent Literature

PTL 1: Unexamined Japanese Patent Publication No. 2014-137849

SUMMARY

The present disclosure relates to an electronic device that reduces deterioration in waterproof and dust-proof performance of a terminal cover.

A first aspect of the present disclosure provides an electronic device. The electronic device includes: a casing having an opening that houses a connection terminal inside; and a terminal cover that seals the opening such that the connection terminal is not exposed. The terminal cover includes a lid that seals the opening and a fixing part that fixes the terminal cover to the casing. The lid includes a protrusion and a cushion member, the cushion member being mounted around the protrusion, and having a surface lower than a surface of the protrusion. The cushion member seals the opening by being in close contact with a member provided around the opening.

A second aspect of the present disclosure provides a terminal cover that covers a connection terminal of an electronic device such that the connection terminal is not exposed. The terminal cover includes a lid that seals an opening that houses the connection terminal, the opening being formed in the electronic device, and a fixing part that fixes the terminal cover to the electronic device. The lid includes a protrusion and a cushion member, the cushion member being mounted around the protrusion, and having a surface lower than a surface of the protrusion. The cushion member seals the opening by being in close contact with a member provided around the opening.

According to the present disclosure, the cushion member provided in the terminal cover can enhance airtightness when the cover is closed, and can secure waterproof and dust-proof properties. Further, the protrusion provided in the terminal cover can reduce contact between the cushion member provided in the terminal cover and a power supply plug or the like during insertion/extraction of the power supply plug or the like. Accordingly, damage to the cushion member can be reduced. As a result, airtightness, that is, waterproof and dust-proof performance, of the terminal cover can be kept longer.

DETAILED DESCRIPTION

Hereinafter, exemplary embodiments are described in detail with reference to the drawings as appropriate. However, detailed description beyond necessity may be omitted. For example, detailed description of a matter that has been already known well or overlapping description of substantially the same configuration may be omitted. This is to avoid unnecessary redundancy of the following description and to facilitate understanding by those skilled in the art.

Note that the inventors of the present disclosure provide the attached drawings and the following description for those skilled in the art to fully understand the present disclosure, and do not intend to limit the subject matter as described in the appended claims by these drawings and description.

First Exemplary Embodiment

[1-1. Entire Configuration]

Figure 1:
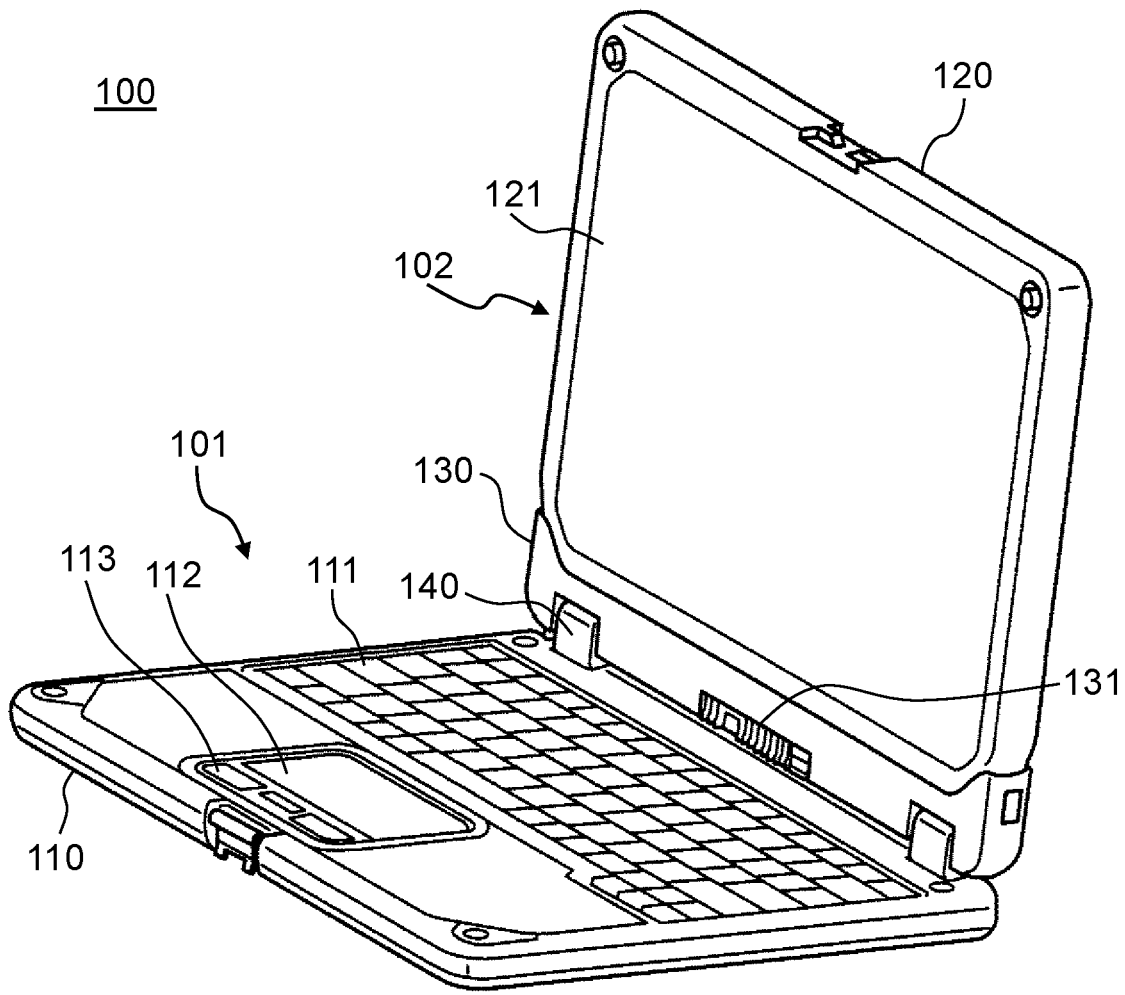
FIG. 1 is a perspective view of an information processing device according to a first exemplary embodiment of the present disclosure.
Figure 1:
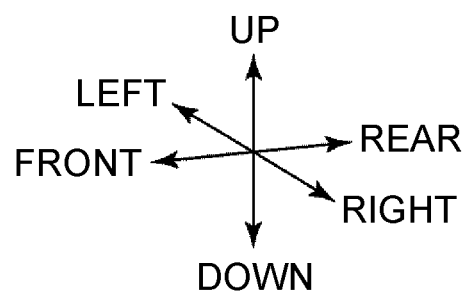

FIG. 1 is a perspective view of an information processing device according to a first exemplary embodiment of the present disclosure. The information processing device serves as an example of an electronic device including a terminal cover.

As shown in FIG. 1, information processing device 100 includes first unit 101 and second unit 102. Second unit 102 is detachable from first unit 101. In a case where second unit 102 is attached to first unit 101, information processing device 100 can be utilized as a notebook type computer. Further, second unit 102 can be utilized alone as a tablet type computer. In this way, information processing device 100 is a so-called detachable type computer.

Second unit 102 alone has a function as the tablet type computer. Second unit 102 includes display 121. Display 121 is configured, for example, with a liquid crystal display device, and is mounted on one principal surface of second casing 120. Display 121 may be configured with another display device, such as an organic EL device. Display 121 is provided with a touch panel disposed on the liquid crystal display device and capable of receiving user's touch operation. In order to realize the function as the computer, second unit 102 incorporates a central processing unit (CPU), a volatile storage (RAM), a nonvolatile storage (ROM, SSD, or the like), a battery, and the like. The nonvolatile storage (ROM, SSD, or the like) stores an operating system (OS), various application programs, various data, and the like. The central processing unit (CPU) executes arithmetic processing by reading the OS, the application programs, and the various data, thereby realizing various functions.

First unit 101 includes first casing 110, holder 130, and hinge 140. First casing 110 is formed of metal, such as magnesium alloy, or resin. First unit 101 includes an input part through which the user performs input operation on the second unit. As the input part, first casing 110 is provided with keyboard 111, touch pad 112, operation buttons 113, and the like.

Holder 130 is electrically or mechanically connected with first unit 101. Holder 130 attaches second unit 102 by housing a part of second unit 102. When second unit 102 is attached, holder 130 electrically connects first unit 101 with second unit 102.

Hinge 140 couples holder 130 (i.e., second unit 102) and first unit 101 such that holder 130 can rotate with respect to first unit 101.

A connector (not shown) connected with a connector (not shown) of the second unit is provided within holder 130. Further, wiring for exchanging various signals or electric power between holder 130 and first unit 101 is passed through an inside of hinge 140. Various signals and electric power can be given and received between first unit 101 and second unit 102 via these connectors and wiring.

Figure 2:
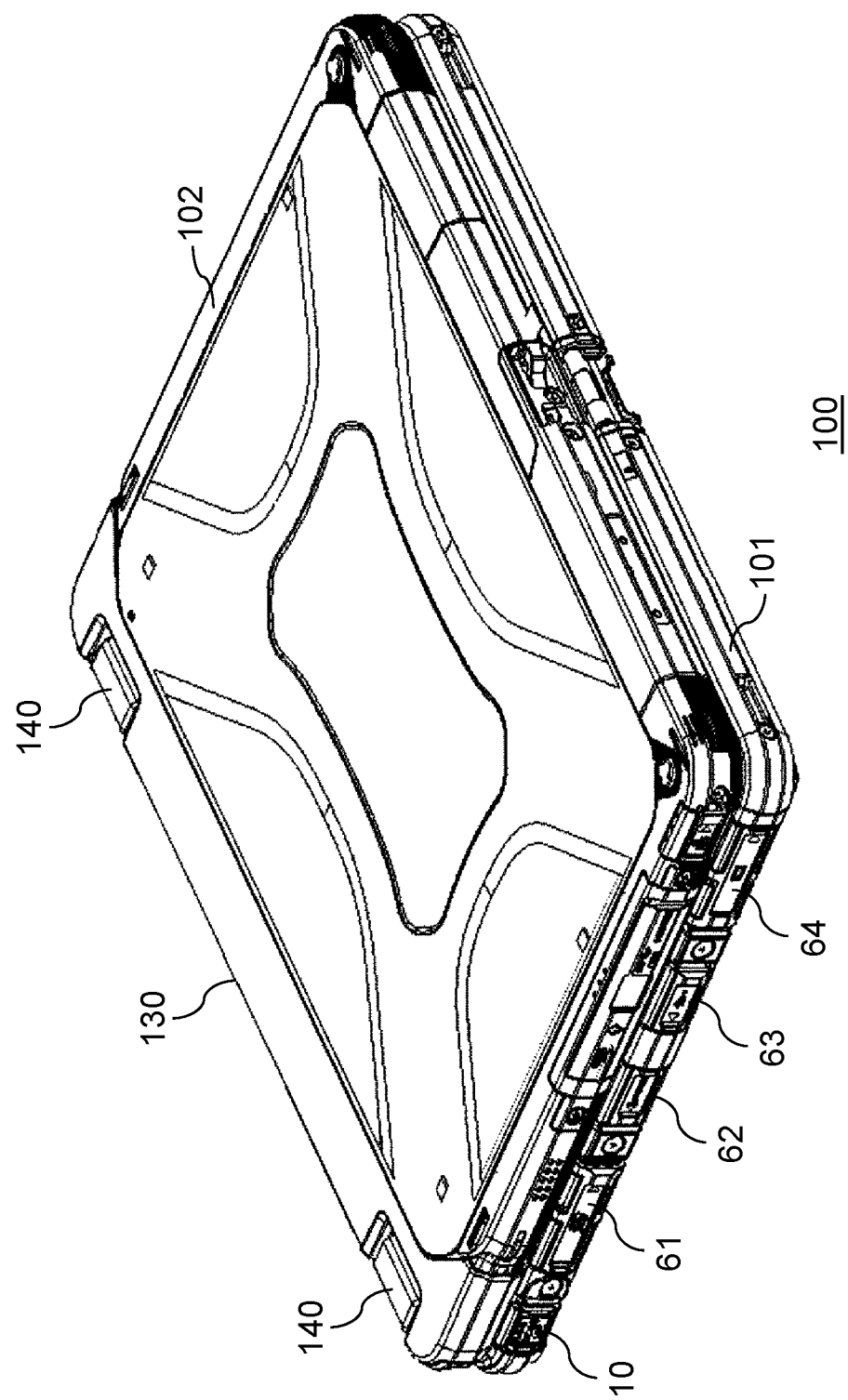
FIG. 2 is a perspective view of the information processing device in a state in which a second unit is closed with respect to a first unit.

FIG. 2 is a perspective view of information processing device 100 in a state in which second unit 102 is closed with respect to first unit 101. Connection terminals for connecting a power supply plug, an external device, a memory card, and the like are provided on a side surface of first unit 101. The respective connection terminals are provided with terminal covers 10, 61 to 64 such that the connection terminals are not exposed when the connection terminals are not used. For example, terminal cover 10 is provided for the connection terminal that connects a terminal of the power supply plug configured to supply power from a power supply adapter. Further, terminal cover 61 is provided for the connection terminal for the memory card (an insertion port for the memory card). Further, terminal covers 62, 63, 64 are provided to cover an HDMI (registered trademark, the same applies hereinafter) terminal, a USB terminal, and a display terminal, respectively.

In the same way as first unit 101, second unit 102 is also provided with a connection terminal for the memory card, an earphone/microphone connection terminal, the HDMI terminal, the USB terminal, and the like. A waterproof and dust-proof terminal cover is provided for each of the terminals.

[1-2. Terminal Cover of Connection Terminal for Power Supply Plug]

Figure 3:
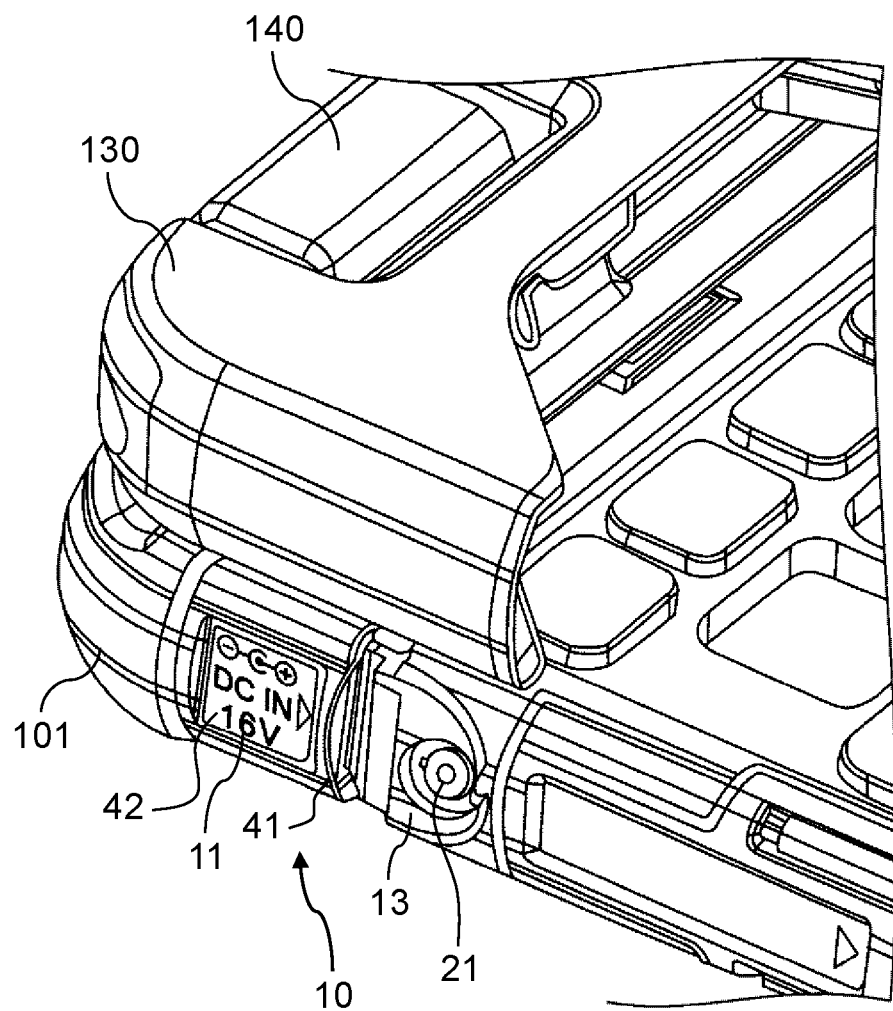
FIG. 3 is an enlarged view of a region near a terminal cover of a connection terminal for a power supply plug.

FIG. 3 is an enlarged view of a region near terminal cover 10 that covers the connection terminal for the power supply plug. It should be noted that FIG. 3 shows a state in which second unit 102 is detached from holder 130. In FIG. 3, terminal cover 10 is closed such that the connection terminal for the power supply plug is not exposed. When terminal cover 10 is closed, terminal cover 10 seals an insertion port for a power supply plug such that terminal cover 10 can fully exhibit waterproof and dust-proof performance. Terminal cover 10 is constituted of two members 41, 42. Member 42 is mounted on member 41 so as to be slidable on member 41. Moreover, terminal cover 10 can be locked by sliding member 42 to a rear side of first unit 101 (details are described below).

Figure 4:
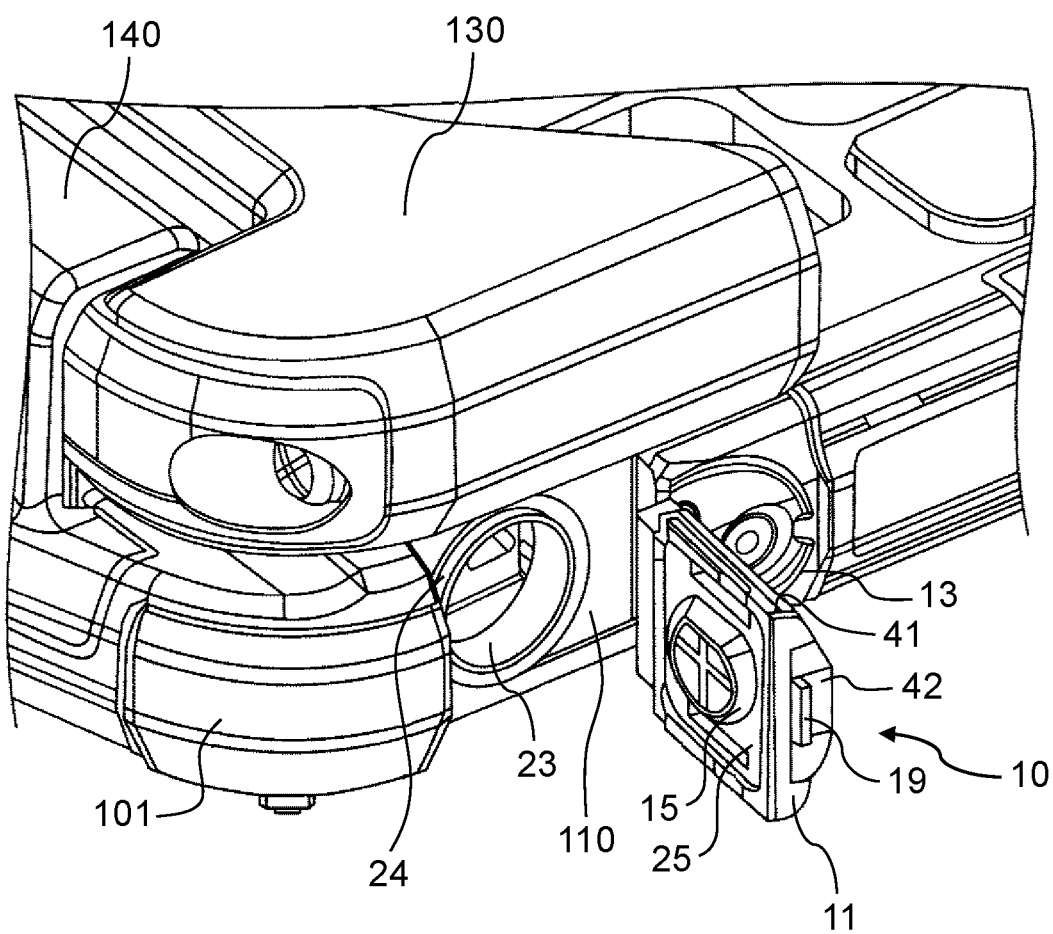
FIG. 4 is a view showing a state in which an insertion port for a power supply plug is exposed while the terminal cover is opened.

FIG. 4 is a view showing a state in which terminal cover 10 is opened and insertion port 23 (an opening) for the power supply plug is exposed. Insertion port 23 (the opening) for the power supply plug is provided in first casing 110, and the connection terminal for the power supply plug is housed in an interior of insertion port 23. The state shown in FIG. 4 is a state in which the connection terminal for the power supply plug is also exposed. Rib 24 is provided in a region around insertion port 23 for the power supply plug in first casing 110.

Figure 5A:
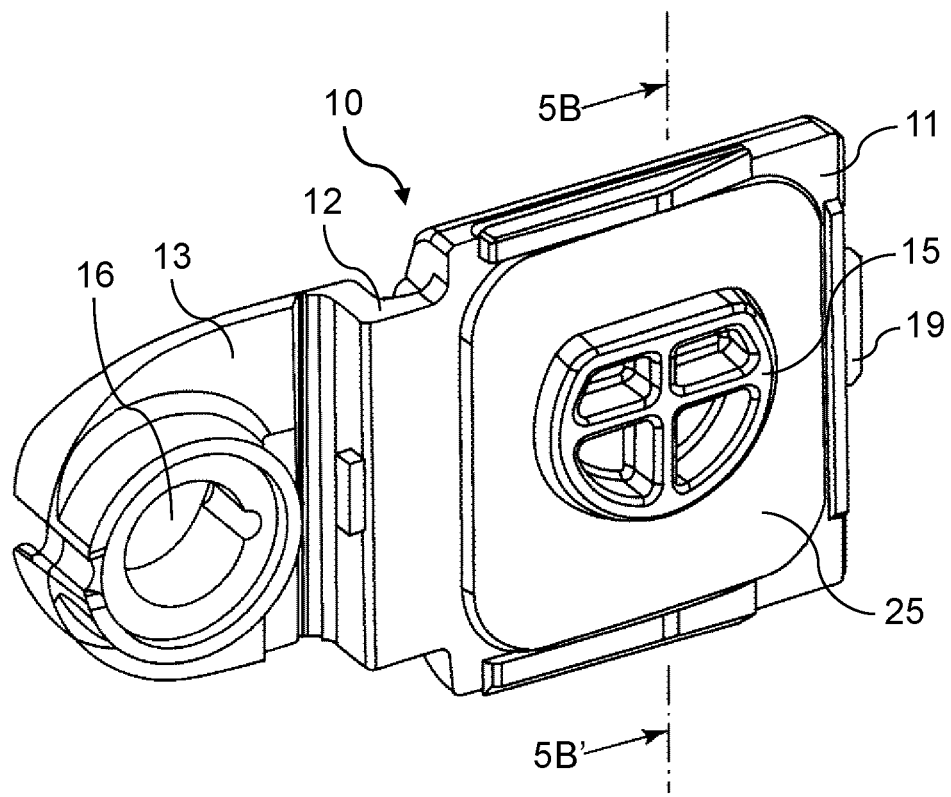
FIG. 5A is a view showing an entire configuration of the terminal cover.
Figure 5B:
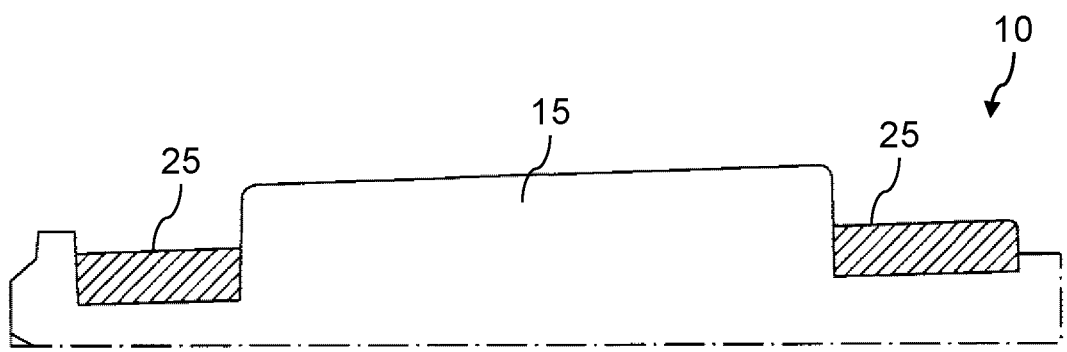
FIG. 5B is a sectional view of the terminal cover taken along line 5B-5B in FIG. 5A.

FIG. 5A is a view showing a configuration of terminal cover 10. FIG. 5B is a sectional view of lid 11 taken along line 5B-5B in FIG. 5A.

Terminal cover 10 includes lid 11, fixing part 13, and coupling part 12. Lid 11 seals insertion port 23 for the power supply plug. Fixing part 13 fixes terminal cover 10 to the casing of first unit 101. Coupling part 12 couples lid 11 to fixing part 13. Lid 11, coupling part 12, and fixing part 13 are integrally formed of a resin material having elasticity.

Coupling part 12 functions as a hinge. Fixing part 13 has opening 16 in a center. Terminal cover 10 is fixed to casing 110 of first unit 101 by being fastened with screw 21 via this opening 16.

As shown in FIGS. 5A and 5B, lid 11 has protrusion 15 in a center of a principal surface opposite to insertion port 23 for the power supply plug. Cushion member 25 is mounted around protrusion 15. An outside diameter of protrusion 15 is smaller than an inner diameter of insertion port 23. Protrusion 15 is housed in insertion port 23 in a state in which lid 11 is completely closed. Cushion member 25 is formed of a material having elasticity, such as urethane resin or rubber. Protrusion 15 is formed such that a surface of protrusion 15 is higher than a surface of cushion member 25. Protrusion 15 is formed of a resin material or the like harder than the material forming cushion member 25. The protrusion 15 includes multiple recessed spaces 27 arranged in a 2×2 array and separated by substantially orthogonal walls.

Lid 11 has an area to an extent that at least whole insertion port 23 for the power supply plug can be covered. When lid 11 is completely closed to first unit 101, cushion member 25 of lid 11 is in close contact with rib 24 provided around insertion port 23 for the power supply plug. Accordingly, insertion port 23 is sealed. With this configuration, waterproof and dust-proof properties of insertion port 23 are secured.

Figure 6:
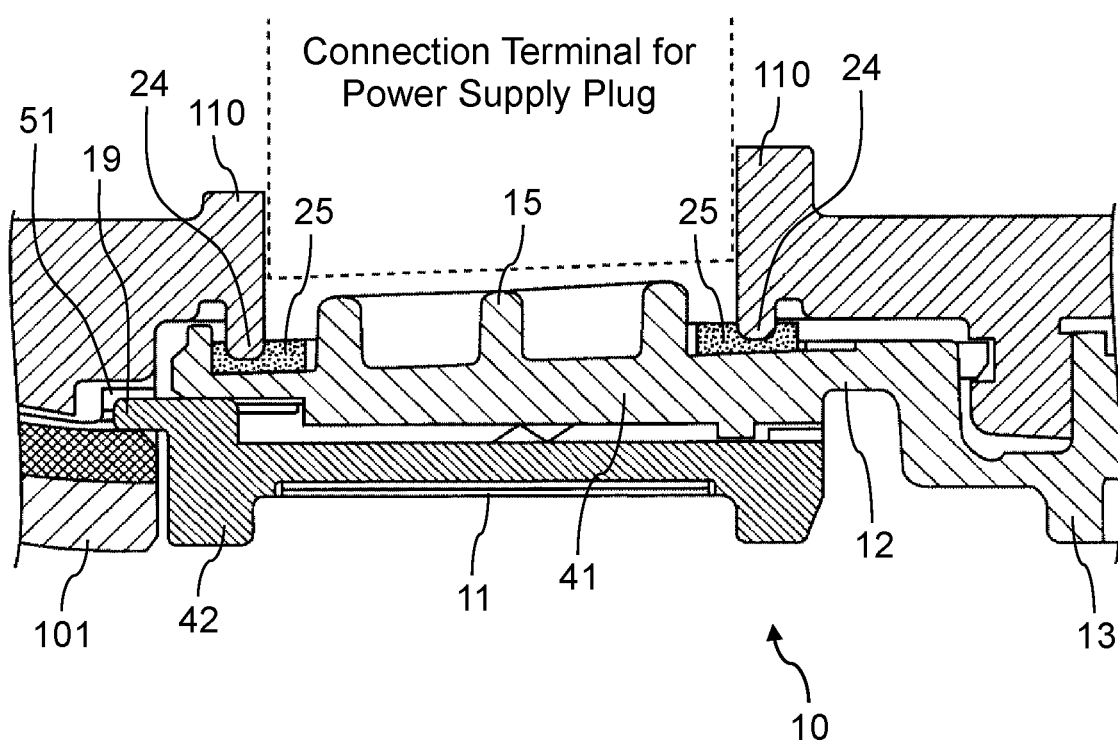
FIG. 6 is a sectional view of the information processing device in a state in which the terminal cover is closed.

FIG. 6 is a view showing a cross section near lid 11 in information processing device 100 (a cross section cut along a surface parallel to a principal surface of first unit 101) in a state in which lid 11 is closed with respect to first unit 101. Terminal cover 10 includes two members; member 41 and member 42 disposed outside of member 41. Member 41 is a member in which lid 11, coupling part 12, and fixing part 13 are integrally formed. Member 42 has projection 19 at a tip, and is mounted on member 41 so as to be slidable on member 41. By sliding member 42 to the rear side of first unit 101 in a state in which terminal cover 10 is closed, projection 19 is inserted in housing part 51 provided within first unit 101. With this configuration, lid 11 is fixed (locked) to first unit 101. At this time, cushion member 25 of lid 11 is in close contact with rib 24 provided around insertion port 23 for the power supply plug. With this configuration, insertion port 23 for the power supply plug (that is, an internal space of first unit 101 that houses the connection terminal connected with the power supply plug) is sealed, and waterproof and dust-proof properties are secured.

In terminal cover 10 configured as above, protrusion 15 can reduce damage to cushion member 25 accompanied with insertion/extraction of the power supply plug. This damage reduction is described below with reference to FIGS. 7 and 8.

Figure 7:
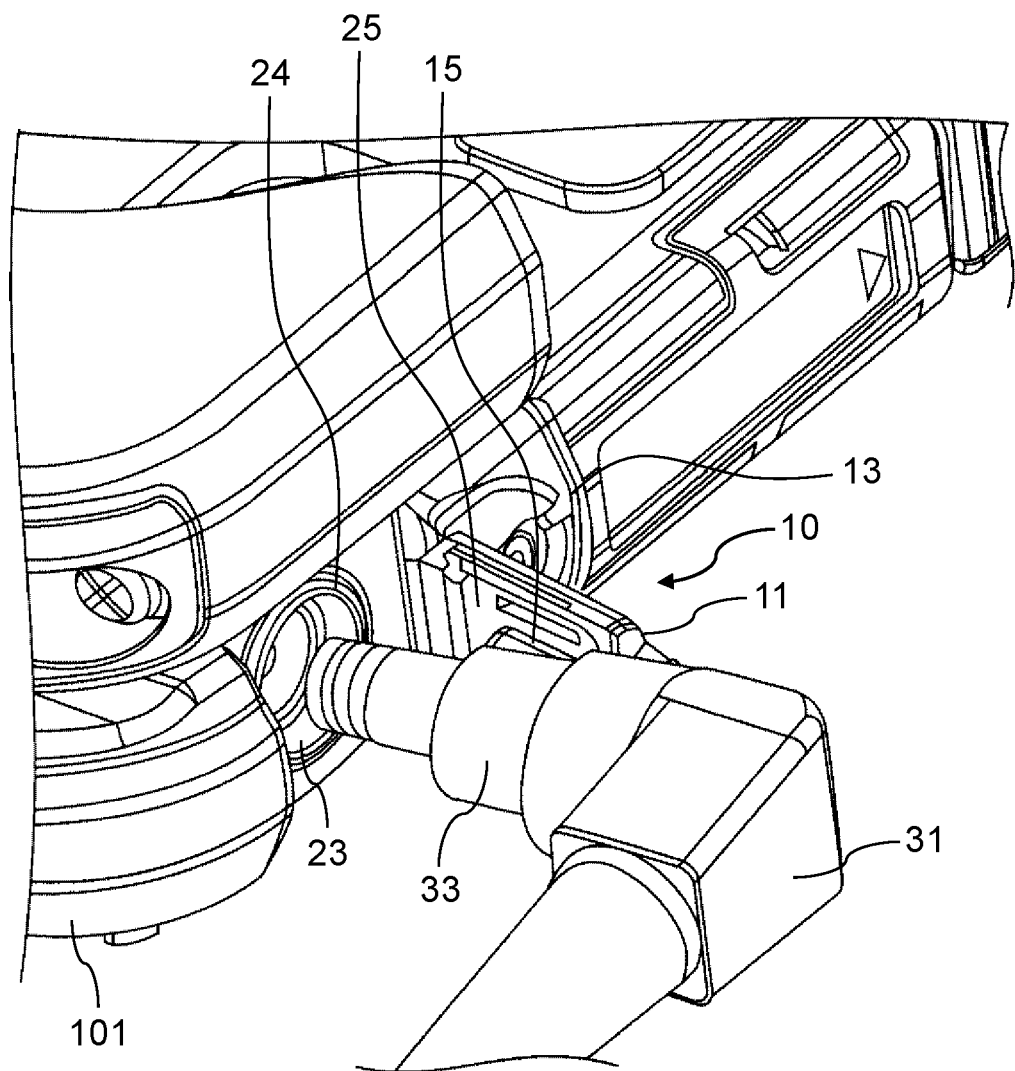
FIG. 7 is a view explaining a state when the power supply plug is inserted in/extracted from the insertion port for the power supply plug.
Figure 8:
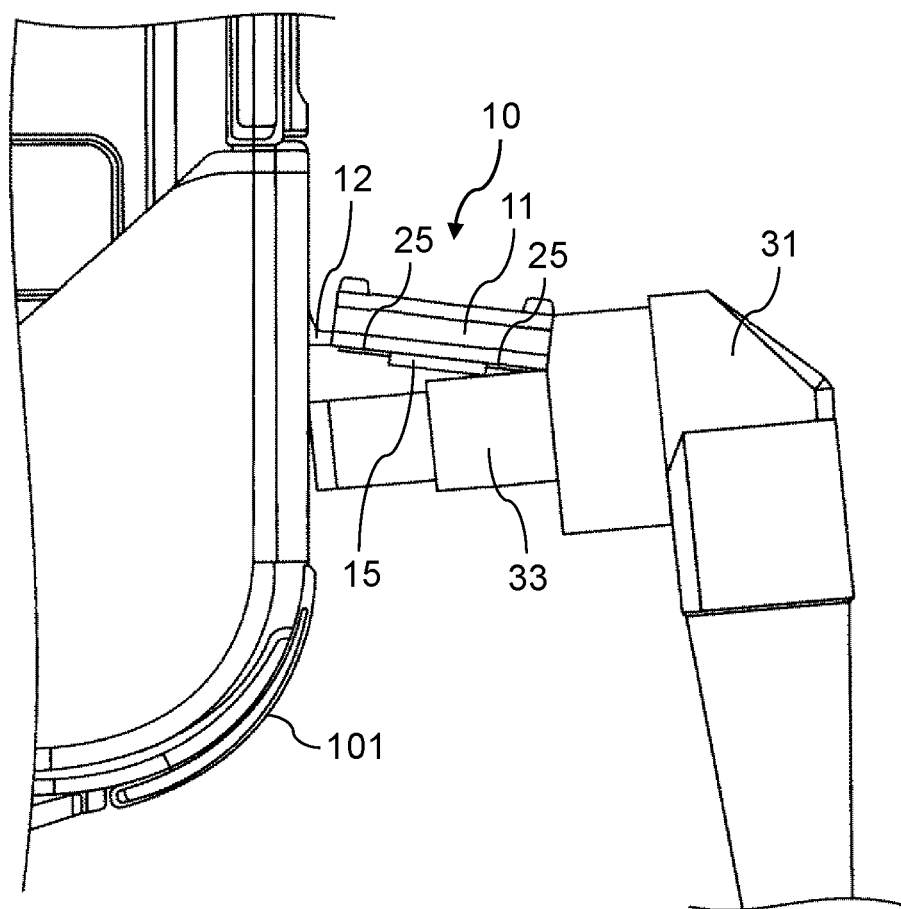
FIG. 8 is a view explaining a state when the power supply plug is inserted in/extracted from the insertion port for the power supply plug.

FIGS. 7 and 8 are views explaining a state when power supply plug 31 is inserted in/extracted from insertion port 23 for the power supply plug of first unit 101 while terminal cover 10 is opened. When power supply plug 31 is inserted/extracted, protrusion 15 of lid 11 of terminal cover 10 abuts on terminal 33 of power supply plug 31. As a result, contact between cushion member 25 of terminal cover 10 and power supply plug 31 is reduced during insertion/extraction of power supply plug 31. Hence, abrasion or damage of cushion member 25 due to the contact with power supply plug 31 during the insertion/extraction of power supply plug 31 can be reduced, and airtightness (that is, waterproof and dust-proof performance) by cushion member 25 can be kept long.

As shown in FIG. 5A, it is preferable that a shape of protrusion 15 provided inside terminal cover 10 be a shape having no corners (rounded shape). This is because, when power supply plug 31 is rotated in a state in which the power supply plug is inserted in insertion port 23, catching of power supply plug 31 on protrusion 15 can be reduced. Further, in an example shown in FIG. 5A, a contour shape of protrusion 15 is not a circle, but is a shape in which an upper part (a part) of a circle is cut. This is to facilitate positioning of cushion member 25 when cushion member 25 is mounted.

[1-3. Effects Etc.]

As described above, information processing device 100 of the present exemplary embodiment includes first casing 110 and terminal cover 10. Terminal cover 10 seals insertion port 23 (an example of the opening) such that the terminal connected to terminal 33 of power supply plug 31 is not exposed. Terminal cover 10 includes lid 11 that seals insertion port 23 and fixing part 13 that fixes terminal cover 10 to casing 110. Lid 11 includes protrusion 15 and cushion member 25. Cushion member 25 is mounted around protrusion 15, and has the surface lower than the surface of the protrusion. In other words, protrusion 15 is formed such that its surface protrudes more than the surface of cushion member 25. Cushion member 25 is in close contact with rib 24 provided around insertion port 23, thereby sealing insertion port 23.

With this configuration, cushion member 25 can enhance airtightness when the cover is closed, and can secure waterproof and dust-proof properties. Simultaneously, when power supply plug 31 is inserted in/extracted from insertion port 23 for the power supply plug, terminal 33 of the power supply plug comes into contact with protrusion 15 of terminal cover 10. Accordingly, terminal 33 of power supply plug 31 can be prevented from coming into contact with cushion member 25. With this configuration, abrasion or damage of the cushion member accompanied with the insertion/extraction of the power supply plug can be reduced, and deterioration in waterproof and dust-proof properties of terminal cover 10 can be reduced.

Other Exemplary Embodiments

As above, the first exemplary embodiment is described as an illustration of a technique disclosed in the present application. However, the technique in the present disclosure is not limited to this first exemplary embodiment, and is also applicable to exemplary embodiments that are appropriately changed, replaced, added, omitted, or the like. Further, a new exemplary embodiment can be implemented by combining the respective components explained in the above-described first exemplary embodiment. Therefore, other exemplary embodiments are described below.

In the first exemplary embodiment, as shown in FIG. 5A, the contour of protrusion 15 of the terminal cover is formed in the shape in which the upper part of the circle is cut. However, the contour is not limited to this shape. An essential requirement for protrusion 15 of the terminal cover is that a height of protrusion 15 is greater than a height of cushion member 25. Any shape can be employed for the contour shape.

Further, in the first exemplary embodiment, description is given of an example in which protrusion 15 is provided in terminal cover 10 for the connection terminal for the power supply plug. However, an idea of the present disclosure can be applied to a terminal cover for another kind of connection terminal. For example, the protrusion or the cushion member may be provided in terminal cover 61 for the connection terminal (the insertion port) for the memory card, or in terminal covers 62, 63, 64 for the HDMI terminal, the USB terminal, the display terminal, respectively. Cushion member 25 can enhance airtightness when the terminal cover is closed and secure waterproof and dust-proof properties. Moreover, protrusion 15 can reduce abrasion or damage of cushion member 25 accompanied with the insertion/extraction of the memory card or the connection terminal.

In the first exemplary embodiment, rib 24 that is in close contact with cushion member 25 and seals the opening (insertion port 23) is formed in first casing 110. However, rib 24 may be formed in a member other than first casing 110. In other words, the rib may be formed in any member if the rib can be in close contact with cushion member 25 and seal the opening (insertion port 23).

In the first exemplary embodiment, the so-called detachable type computer is described as an example of the electronic device. However, the idea about the terminal cover of the present disclosure can be applied to other kinds of electronic devices. For example, the idea of the present disclosure can be applied to an electronic device including connection terminals, such as a notebook type personal computer, a tablet terminal, a smartphone, a cell phone, or a digital camera.

As above, the exemplary embodiments are described as the illustration of the technique in the present disclosure. For that purpose, the attached drawings and the detailed description are provided.

Therefore, the components mentioned in the attached drawings and the detailed description may include not only components that are essential for solving the problems, but also components that are not essential for solving the problems to illustrate the above-described technique. Accordingly, those nonessential components should not be immediately recognized as essential just because those nonessential components are mentioned in the attached drawings or the detailed description.

Further, since the aforementioned exemplary embodiments illustrate the technique in the present disclosure, various changes, replacements, additions, omissions, or the like can be made in the claims and their equivalents.

The present disclosure is useful for an electronic device having a terminal cover that covers a connection terminal for connecting an external device, a power supply plug, or the like, and requiring waterproof and dust-proof properties to the terminal cover (for example, a notebook personal computer, a tablet terminal, a smartphone, a cell phone, or a digital camera).

What is claimed is:

1. An electronic device comprising:
    a casing having an opening that houses a connection terminal inside; and
    a terminal cover that seals the opening such that the connection terminal is not exposed,
    wherein,
        the terminal cover includes a lid that seals the opening and a fixing part that fixes the terminal cover to the casing,
        the lid includes a protrusion and a cushion member, the cushion member being mounted around the protrusion, and
        the protrusion comprises multiple recessed spaces separated by orthogonal walls.

2. The electronic device according to claim 1, wherein the protrusion is provided in a center of the lid.

3. The electronic device according to claim 1, wherein at least a part of a contour of the protrusion is formed in a rounded shape having no corners.

4. The electronic device according to claim 1, wherein the connection terminal is a terminal for receiving electric power from an outside of the electronic device.

5. The electronic device according to claim 1, wherein
    the casing includes a housing part near the opening,
    the terminal cover includes a slidable member,
    the slidable member does not include the lid and the fixing part, and
    the slidable member includes a projection at a tip, the projection is inserted in the housing part when terminal cover is closed.

6. The electronic device according to claim 1, wherein the electronic device is any one of a notebook type personal computer, a tablet terminal, a smartphone, a cell phone, and a digital camera.

7. A terminal cover that covers a connection terminal of an electronic device such that the connection terminal is not exposed, the terminal cover comprising:
    a lid that seals an opening that houses the connection terminal, the opening being formed in the electronic device; and
    a fixing part that fixes the terminal cover to the electronic device,
    wherein,
        the lid includes a protrusion and a cushion member, the cushion member being mounted around the protrusion and having a surface lower than a surface of the protrusion, and
        the protrusion comprises multiple recessed spaces separated by orthogonal walls.

8. The terminal cover according to claim 7, wherein the protrusion is provided in a center of the lid.

9. The terminal cover according to claim 7, wherein at least a part of a contour of the protrusion is formed in a rounded shape having no corners.

10. The terminal cover according to claim 7, wherein the connection terminal is a terminal for receiving electric power from an outside of the electronic device.

11. The terminal cover according to claim 7, wherein
    the electronic device includes a housing part near the opening,
    the terminal cover includes a slidable member, and
    the slidable member does not include the lid and the fixing part, and
    the slidable member includes a projection at a tip, the projection is inserted in the housing part in which terminal cover is closed.

* * * * *